(12) United States Patent
Kuboyama et al.

(10) Patent No.: US 10,516,330 B2
(45) Date of Patent: Dec. 24, 2019

(54) POWER CONVERTING DEVICE FOR CONTROLLING CURRENT BASED ON OSCILLATION COMPONENT OF VOLTAGE AMPLITUDE, AND CURRENT CONTROL METHOD BASED ON OSCILLATION COMPONENT OF VOLTAGE AMPLITUDE

(71) Applicant: Kabushiki Kaisha Yaskawa Denki, Kitakyushu-shi (JP)

(72) Inventors: Takashi Kuboyama, Kitakyushu (JP); Sadao Ishii, Kitakyushu (JP)

(73) Assignee: Kabushiki Kaisha Yaskawa Denki, Kitakyushu-shi (JP)

(*) Notice: Subject to any disclaimer, the term of this patent is extended or adjusted under 35 U.S.C. 154(b) by 0 days.

(21) Appl. No.: 15/473,880

(22) Filed: Mar. 30, 2017

(65) Prior Publication Data
US 2017/0207698 A1  Jul. 20, 2017

Related U.S. Application Data (63) Continuation of application No. PCT/JP2014/076081, filed on Sep. 30, 2014.

(51) Int. Cl.
*H02M 1/14* (2006.01)
*G01R 19/04* (2006.01)
(Continued)

(52) U.S. Cl.
CPC .............. *H02M 1/14* (2013.01); *G01R 19/04* (2013.01); *H02J 3/24* (2013.01); *H02M 7/537* (2013.01);
(Continued)

(58) Field of Classification Search
CPC .................. H02M 1/08; H02M 7/537; H02M 2001/0009; H02M 1/14; H02M 1/32;
(Continued)

(56) References Cited

U.S. PATENT DOCUMENTS 5,532,569 A * 7/1996 Tanamachi ........ H02M 7/53873
318/802
6,154,379 A * 11/2000 Okita ...................... H02M 7/48
363/40

(Continued)

FOREIGN PATENT DOCUMENTS

EP  2566033 A2 * 3/2013 ............. H02M 1/12
JP  2004-153957 A  5/2004
(Continued)

OTHER PUBLICATIONS

International Search Report dated Dec. 16, 2014, in International Patent Application No. PCT/JP2014/076081 filed Sep. 30, 2014 (w/ English translation).

(Continued)

*Primary Examiner* — Gustavo A Rosario-Benitez
(74) *Attorney, Agent, or Firm* — Oblon, McClelland, Maier & Neustadt, L.L.P.

(57) ABSTRACT

A power converting device includes power conversion circuitry connected to a power system, voltage amplitude determination circuitry that determines a voltage amplitude of the power system, and control circuitry that controls an output current from the power conversion circuitry to the power system based on an oscillation component of the voltage amplitude determined by the voltage amplitude determination circuitry.

20 Claims, 8 Drawing Sheets

(51) Int. Cl.
*H02M 7/537* (2006.01)
*H02J 3/24* (2006.01)
*H02M 7/5387* (2007.01)
*H02M 1/08* (2006.01)
*H02M 1/00* (2006.01)
*H02J 3/38* (2006.01)

(52) U.S. Cl.
CPC ........... *H02M 7/53875* (2013.01); *H02J 3/38* (2013.01); *H02M 1/08* (2013.01); *H02M 2001/0009* (2013.01)

(58) Field of Classification Search
CPC ....... H02M 1/4216; H02M 2007/4803; H02M 7/525; H02M 5/452; H02M 5/451; H02M 5/4585; H02M 7/53803; H02P 27/06; G01R 19/04
See application file for complete search history.

(56) References Cited

U.S. PATENT DOCUMENTS

| | | | | |
|---|---|---|---|---|
| 2006/0012329 | A1* | 1/2006 | Aoki | H02P 21/18 318/721 |
| 2007/0223261 | A1 | 9/2007 | Fujii et al. | |
| 2011/0116295 | A1* | 5/2011 | Ueda | H02M 5/297 363/163 |
| 2011/0121798 | A1* | 5/2011 | Kitanaka | H02M 3/156 323/266 |
| 2011/0127934 | A1* | 6/2011 | Suzuki | B62D 5/046 318/400.02 |
| 2012/0161513 | A1* | 6/2012 | Ohshima | H02M 7/1626 307/11 |
| 2012/0319629 | A1* | 12/2012 | Takaki | H02M 7/53875 318/400.02 |
| 2013/0094258 | A1* | 4/2013 | Royak | H02M 1/32 363/89 |
| 2013/0141023 | A1* | 6/2013 | Sugita | H02P 21/0003 318/400.02 |
| 2014/0078796 | A1* | 3/2014 | Inoue | H02M 5/10 363/68 |
| 2014/0268970 | A1* | 9/2014 | Tanaka | H02M 5/297 363/163 |
| 2015/0256095 | A1* | 9/2015 | Ohta | H02M 7/4826 363/37 |
| 2016/0094134 | A1* | 3/2016 | Iyasu | H02M 3/33515 363/17 |
| 2017/0117816 | A1* | 4/2017 | Ohta | H02P 27/06 |

FOREIGN PATENT DOCUMENTS

| | | |
|---|---|---|
| JP | 2007-259567 A | 10/2007 |
| JP | 2008-059968 A | 3/2008 |
| JP | 2013-085364 A | 5/2013 |

OTHER PUBLICATIONS

Office Action dated Nov. 1, 2016, in Japanese Patent Application No. 2016-551383 filed Sep. 30, 2014 (w/ Computer-generated English translation).

* cited by examiner

POWER CONVERTING DEVICE FOR CONTROLLING CURRENT BASED ON OSCILLATION COMPONENT OF VOLTAGE AMPLITUDE, AND CURRENT CONTROL METHOD BASED ON OSCILLATION COMPONENT OF VOLTAGE AMPLITUDE

CROSS-REFERENCE TO RELATED APPLICATIONS

The present application is a bypass continuation of and claims the benefit of priority to PCT/JP2014/076081 filed Sep. 30, 2014, the entire contents of which are incorporated herein by reference.

BACKGROUND OF THE INVENTION

Field of the Invention

The present invention relates to a power converting device, a power generating system, and a current control method.

Description of the Related Art

For example, JP-A-2013-85364 describes a power converting device. In JP-A-2013-85364, phase information from a normal time before a power system voltage drop abnormality occurs is held, and an output current is controlled based on the phase information held when it is determined that a power system voltage drop abnormality has occurred. The entire contents of this publication are incorporated herein by reference.

SUMMARY OF THE INVENTION

According to one aspect of the present invention, a power converting device includes power conversion circuitry connected to a power system, voltage amplitude determination circuitry that determines a voltage amplitude of the power system, and control circuitry that controls an output current from the power conversion circuitry to the power system based on an oscillation component of the voltage amplitude determined by the voltage amplitude determination circuitry.

According to another aspect of the present invention, a current control method includes determining, using voltage amplitude determination circuitry, a voltage amplitude of a power system connected to power conversion circuitry, and controlling, using control circuitry, an output current from the power conversion circuitry to the power system based on an oscillation component of the determined voltage amplitude, which is determined using voltage amplitude determination circuitry.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE EMBODIMENTS

The embodiments will now be described with reference to the accompanying drawings, wherein like reference numerals designate corresponding or identical elements throughout the various drawings.

Power Generating System

Figure 1:
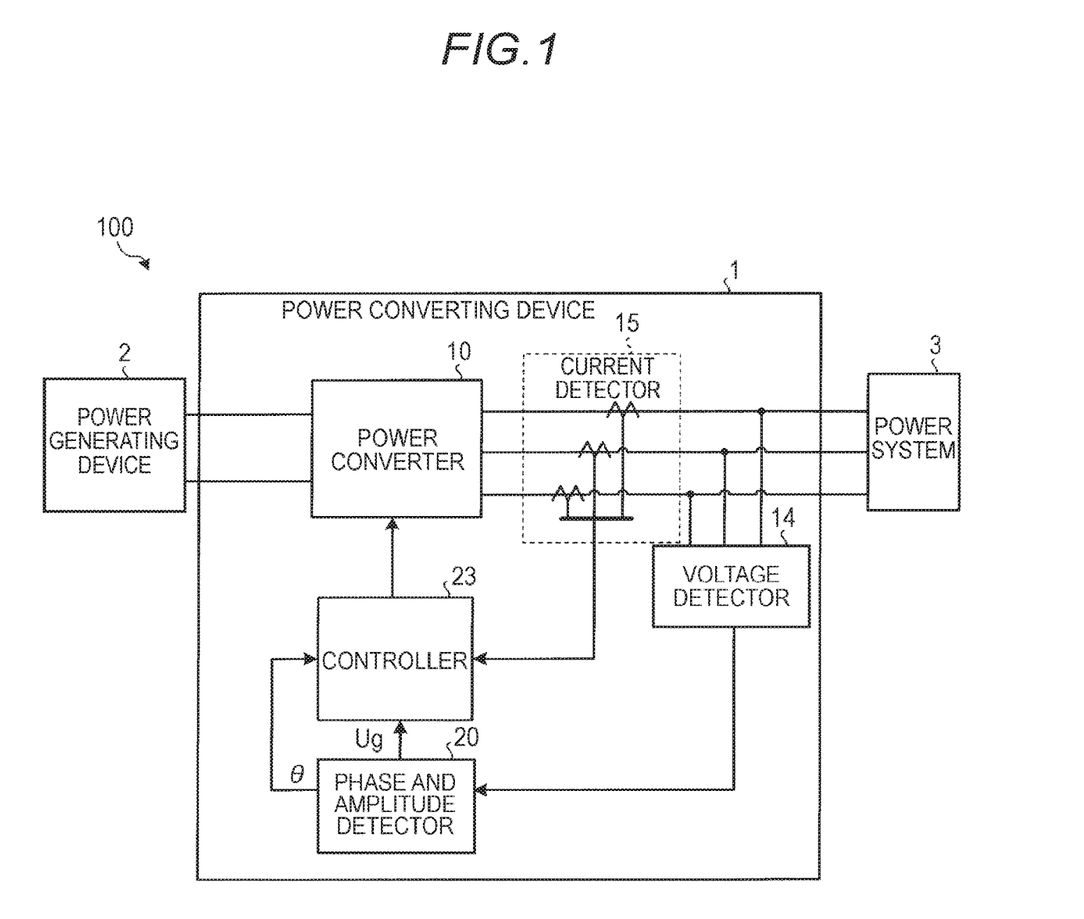
FIG. 1 is a diagram showing a configuration example of a power generating system according to an embodiment.

FIG. 1 is a diagram showing a configuration example of a power generating system according to the embodiment. A power generating system 100 shown in FIG. 1 includes a power converting device 1 and a power generating device 2. The power converting device 1 converts direct current power generated in the power generating device 2 into alternating current power in accordance with a voltage and frequency of a power system 3, and outputs the alternating current power to the power system 3. The power generating device 2 is, for example, a photovoltaic cell, a direct current generator, or a fuel cell.

The power converting device 1 includes a power converter 10, a voltage detector 14, a current detector 15, a phase and amplitude detector 20, and a controller 23. The power converter 10, based on a control by the controller 23, converts direct current power supplied from the power generating device 2 into alternating current power in accordance with the voltage and frequency of the power system 3, and outputs the alternating current power to the power system 3.

The voltage detector 14, for example, repeatedly detects a momentary value of the alternating current voltage of the power system 3. The current detector 15, for example, repeatedly detects a momentary value of the output current from the power converter 10 to the power system 3 (may be referred to hereafter as a detected current).

The phase and amplitude detector 20 (one example of a voltage amplitude acquirer), for example, acquires a voltage phase ($\theta$) of the power system 3 and a voltage amplitude (Ug) of the power system 3 based on a result of voltage detection by the voltage detector 14. The phase and amplitude detector 20 can also acquire the voltage phase ($\theta$) and voltage amplitude (Ug) from the exterior.

The controller 23 controls the output current from the power converter 10 to the power system 3 based on an oscillation component of the voltage amplitude (Ug) acquired by the phase and amplitude detector 20. Even when a voltage abnormality such as a line-to-line short circuit (may be also referred to hereafter as a system voltage abnormality) occurs in the power system 3, the output current can be accurately controlled. For example, a state with the voltage of the power system 3 being excessive is also included as a system voltage abnormality.

The controller 23, for example, carries out a coordinate conversion of the detected current in accordance with the voltage phase (θ), and can control the power converter 10 so that the detected current after the coordinate conversion coincides with an output current command. In this case, the controller 23 corrects the detected current or output current command after coordinate conversion in accordance with the oscillation component of the voltage amplitude (Ug). By so doing, the output current can be accurately controlled.

Power Converting Device

Figure 2:
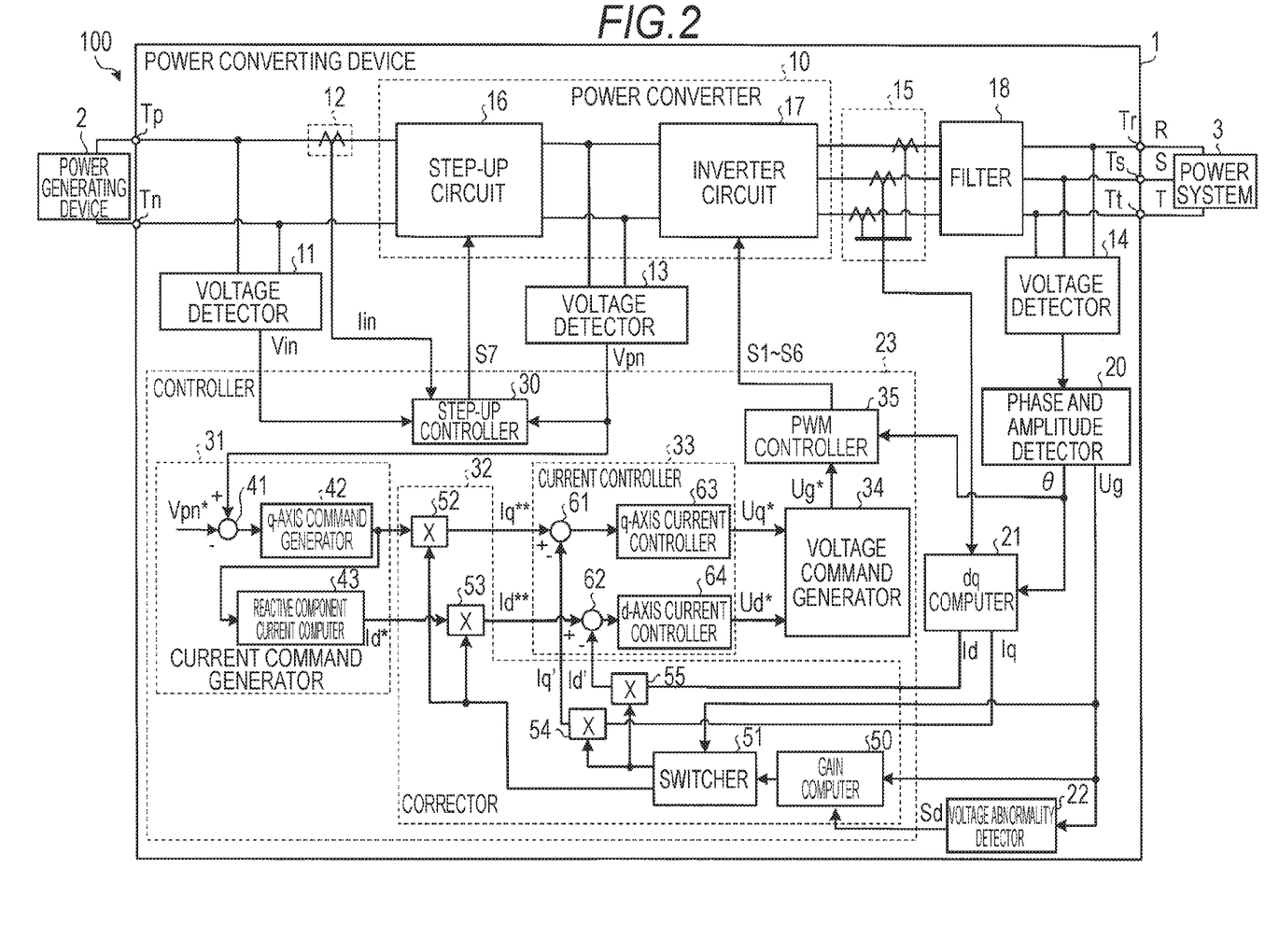
FIG. 2 is a diagram showing one example of a configuration of a power converting device shown in FIG. 1.

FIG. 2 is a diagram showing one example of a configuration of the power converting device 1 shown in FIG. 1. As shown in FIG. 2, the power converting device 1 includes the power converter 10, voltage detectors (11, 13, 14), current detectors (12, 15), a filter 18, input terminals (Tp, Tn), output terminals (Tr, Ts, Tt), the phase and amplitude detector 20, a dq computer 21, a voltage abnormality detector 22, and the controller 23.

The power converter 10 includes a step-up circuit 16 and an inverter 17 circuit. The step-up circuit 16 is, for example, a step-up chopper circuit or DC-DC converter, and the inverter circuit 17 is, for example, a three-phase inverter. The power converter 10 can include, in place of the step-up circuit 16, a step-down circuit that steps down a supply voltage (Vin) to a predetermined voltage, or the power converter 10 may be of a configuration without step-up circuit 16 being provided.

Figure 3:
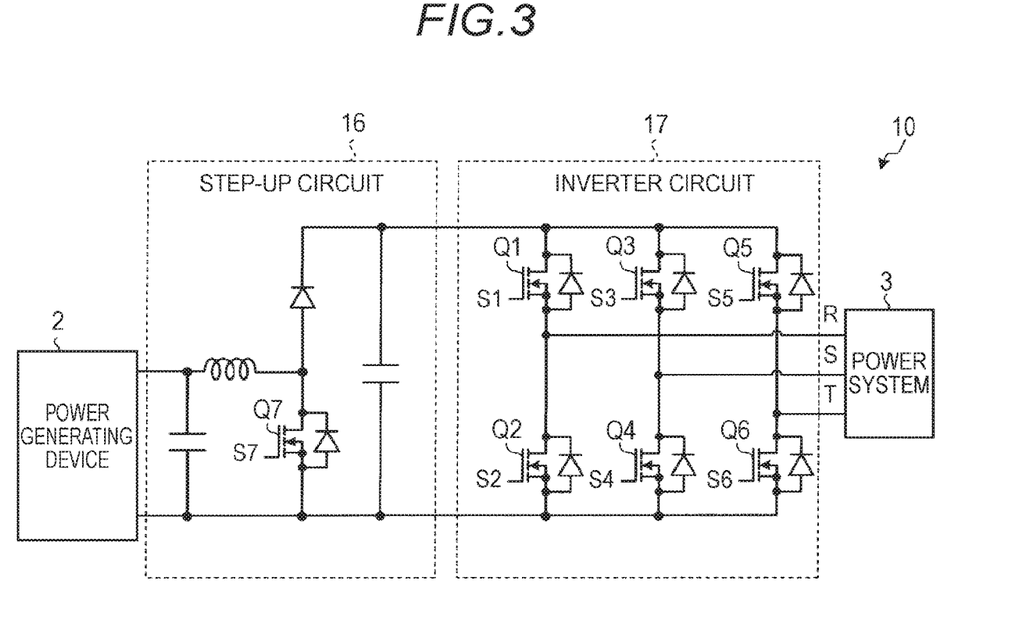
FIG. 3 is a diagram showing one example of a configuration of a power converter shown in FIG. 2.

FIG. 3 is a diagram showing one example of a configuration of the power converter 10. The step-up circuit 16 shown in FIG. 3 is a chopper circuit having a switching element (Q7). The switching element (Q7) is controlled on and off states by a drive signal (S7) output from the controller 23, so that the supply voltage (Vin) is stepped up to a predetermined voltage in the step-up circuit 16. Although not shown in the diagram, the step-up circuit 16, for example, has an amplifier circuit that amplifies the drive signal (S7) output from the controller 23, and inputs the amplified drive signal (S7) into a base of the switching element (Q7).

Also, the inverter circuit 17 shown in FIG. 3 is a three-phase inverter including multiple switching elements (Q1 to Q6) connected in a three-phase bridge. Turning on and off of the switching elements (Q1 to Q6) is controlled by drive signals (S1 to S6) output from the controller 23, whereby direct current voltage is converted into three-phase alternating current voltage in the inverter circuit 17. Although not shown in the diagram, the inverter circuit 17, for example, has an amplifier circuit that amplifies the drive signals (S1 to S6) output from the controller 23, and inputs the amplified drive signals (S1 to S6) into bases of the switching elements (Q1 to Q6).

Returning to FIG. 2, the description of the power converting device 1 will be continued. The voltage detector 11 detects a momentary value of voltage supplied from the power generating device 2 to the power converter 10 as the supply voltage (Vin). Also, the voltage detector 13 detects a momentary value of direct current voltage after stepping-up output from the step-up circuit 16 (hereafter referred to as a direct current bus voltage (Vpn)). The current detector 12, for example, detects a momentary value of direct current supplied from the power generating device 2 to the power converter 10 (hereafter referred to as a supply current (Iin)).

The voltage detector 14, for example, detects a momentary voltage (Vrs) between an R phase and S phase of the power system 3 (hereafter referred to as the interphase voltage (Vrs)), and a momentary voltage (Vst) between the S phase and a T phase of the power system 3 (hereafter referred to as the interphase voltage (Vst)).

The current detector 15, for example, detects a momentary value of alternating currents output from the power converter 10 to the R phase, S phase, and T phase of the power system 3 (hereafter referred to as output currents (Ir, Is, It)). The filter 18 is, for example, an LC filter, and removes switching noise caused by switching of the switching elements (Q1 to Q6) structuring the inverter circuit 17.

The phase and amplitude detector 20 acquires the voltage phase (θ) of the power system 3 and the voltage amplitude (Ug) of the power system 3 based on the interphase voltages (Vrs) and (Vst) detected by the voltage detector 14. For example, the phase and amplitude detector 20 converts the interphase voltages (Vrs, Vst) into alternating current voltages (Vα, Vβ) of biaxial (αβ) components using the computations of the following Expressions 1 and 2.

$$V\alpha = (2Vrs + Vst) \div 2 \qquad 1$$

$$V\beta = \sqrt{3} \times Vst \div 2 \qquad 2$$

The phase and amplitude detector 20, for example, determines the voltage phase (θ) and voltage amplitude (Ug), based on the alternating current voltages (Vα, Vβ), using the computations of the following Expressions 3 and 4.

$$\theta = \tan^{-1}(V\alpha, V\beta) \qquad 3$$

$$Ug = \sqrt{(V\alpha^2 + V\beta^2)} \qquad 4$$

The voltage detector 14 can, for example, detect momentary voltages of the R phase, S phase, and T phase of the power system 3 (hereafter referred to as phase voltages (Vr, Vs, Vt)). In this case, the phase and amplitude detector 20 can, for example, convert the phase voltages (Vr, Vs, Vt) into the alternating current voltages (Vα, Vβ) using three-phase to two-phase conversion.

Also, although the phase and amplitude detector 20 is used for detecting and acquiring the voltage phase (θ) and voltage amplitude (Ug), a configuration may be such that a phase detector that detects and acquires the voltage phase (θ) and an amplitude detector that detects and acquires the voltage amplitude (Ug) (one example of a voltage amplitude acquirer) are individually provided in place of the phase and amplitude detector 20. The phase and amplitude detector 20 can also acquire the voltage phase (θ) and voltage amplitude (Ug) from, for example, a power system management device.

The dq computer 21 converts the output currents (Ir, Is, It) into an α-axis current (Iα) and a β-axis current (Iβ), and converts the α-axis current (Iα) and β-axis current (Iβ) into a q-axis current (Iq) and a d-axis current (Id). The dq computer 21 can, for example, convert the output currents (Ir, Is, It) into the α-axis current (Iα) and β-axis current (Iβ) using the following Expressions 5 and 6, and convert the α-axis current (Iα) and β-axis current (Iβ) into the q-axis current (Iq) and d-axis current (Id) using computations of the following Expressions 7 and 8. The current detector 15 and dq computer 21 function as current acquirers that detect and acquire the q-axis current (Iq) and d-axis current (Id).

$$I\alpha = (3/2) \times Ir \qquad 5$$

$$I\beta = \sqrt{3} \div 2 \times (2 \times Is + Ir) \qquad \qquad 6$$

$$Iq = I\alpha \times \cos\theta + I\beta \times \sin\theta \qquad \qquad 7$$

$$Id = -I\alpha \times \sin\theta + I\beta \times \cos\theta \qquad \qquad 8$$

The voltage abnormality detector 22 detects a voltage abnormality of the power system 3. An abnormality of the phase voltages (Vr, Vs, Vt) is, for example, a drop in the voltage amplitude (Ug) or an imbalance of the phase voltages (Vr, Vs, Vt). The voltage abnormality detector 22 determines that there is a voltage abnormality of the power system 3 when, for example, an amplitude oscillation of a predetermined value or greater is included in the voltage amplitude (Ug). When the voltage abnormality detector 22 determines that there is a voltage abnormality of the power system 3, the voltage abnormality detector 22 outputs an abnormality detection signal (Sd). The voltage abnormality detector 22 can also detect a voltage abnormality of the power system 3 based on the phase voltages (Vr, Vs, Vt) detected by the voltage detector 14.

The controller 23, for example, controls the power converter 10 based on the supply voltage (Vin), direct current bus voltage (Vpn), output currents (Ir, Is, It), voltage phase (θ), voltage amplitude (Ug), q-axis current (Iq), and d-axis current (Id). The controller 23 includes a step-up controller 30, a current command generator 31, a corrector 32, a current controller 33, a voltage command generator 34, and a PWM controller 35. Hereafter, a configuration of the controller 23 is described in detail.

The controller 23, for example, includes a microcomputer having a central processing unit (CPU), a read-only memory (ROM), a random access memory (RAM), an input/output port, and the like, and various kinds of circuit. The CPU of the microcomputer can achieve control of the step-up controller 30, current command generator 31, corrector 32, current controller 33, voltage command generator 34, and PWM controller 35 by reading and executing a program stored in the ROM. The phase and amplitude detector 20, dq computer 21, and voltage abnormality detector 22 may be achieved by the CPU of the microcomputer reading and executing a program stored in the ROM.

Also, the controller 23 can also be such that at least one, or all, of the step-up controller 30, current command generator 31, corrector 32, current controller 33, voltage command generator 34, and PWM controller 35 are structured of hardware such as an application-specific integrated circuit (ASIC) or field-programmable gate array (FPGA). The phase and amplitude detector 20, dq computer 21, and voltage abnormality detector 22 can also be structured of hardware such as an ASIC or FPGA.

The step-up controller 30, based on the supply voltage (Vin) detected by the voltage detector 11 and the supply current (Iin) detected by the current detector 12, uses maximum power point tracking (MPPT) control to generate the drive signal S7 that controls the step-up circuit 16.

The step-up controller 30, for example, determines a supply power (Pin) by multiplying the supply current (Iin) and supply voltage (Vin) together, and generates a direct current voltage command (Vdc*) so that the supply power (Pin) is maximized. Further, the step-up controller 30 generates the drive signal (S7) so that the direct current voltage command (Vdc*) and supply voltage (Vin) coincide.

The current command generator 31 generates a q-axis current command (Iq*) and a d-axis current command (Id*) as output current commands. The current command generator 31 includes a subtractor 41, a q-axis command generator 42, and a reactive component current computer 43.

The subtractor 41 computes a difference between a direct current voltage command (Vpn*) and the direct current bus voltage (Vpn). The q-axis command generator 42, for example, generates the q-axis current command (Iq*) by subjecting the difference between the direct current voltage command (Vpn*) and direct current bus voltage (Vpn) to proportional-integral (PI) control, so that deviation between the direct current voltage command (Vpn*) and direct current bus voltage (Vpn) is zero. The reactive component current computer 43 generates the d-axis current command (Id*) based on the q-axis current command (Iq*). The reactive component current computer 43, for example, stores a power factor setting value, and generates the d-axis current command (Id*) based on the power factor setting value and q-axis current command (Iq*). The power factor setting value can be set and changed based on an input from an unshown input unit.

The corrector 32, based on the oscillation component of the voltage amplitude (Ug) acquired by the phase and amplitude detector 20, corrects the q-axis current command (Iq*) and d-axis current command (Id*) or the q-axis current (Iq) and d-axis current (Id). Owing to this correction, the output current can be accurately controlled when there is a system voltage abnormality. A configuration of the corrector 32 is described in detail hereafter.

The current controller 33, based on a q-axis current command (Iq) and d-axis current command (Id) and on a q-axis current (Iq') and d-axis current (Id'), generates a q-axis voltage command (Uq*) and d-axis voltage command (Ud*). The current controller 33 includes subtractors (61, 62), a q-axis current controller 63, and a d-axis current controller 64.

The subtractor 61 subtracts the q-axis current (Iq') from the q-axis current command (Iq), and the subtractor 62 subtracts the d-axis current (Id') from the d-axis current command (Id). The q-axis current controller 63, for example, generates the q-axis voltage command (Uq*) by subjecting a result of the subtraction by the subtractor 61 to PI control, so that deviation between the q-axis current command (Iq) and q-axis current (Iq') is zero. Also, the d-axis current controller 64** generates the d-axis voltage command (Ud*) by subjecting a result of the subtraction by the subtractor 62 to PI control, so that deviation between the d-axis current command (Id**) and d-axis current (Id') is zero.

The voltage command generator 34, based on the q-axis voltage command (Uq*) and d-axis voltage command (Ud*), generates a voltage amplitude command (Ug*). The voltage command generator 34, for example, determines the voltage amplitude command (Ug*) using a computation of the following Expression 9.

$$Ug^* = (Uq^{*2} + Ud^{*2})^{1/2} \qquad \qquad 9$$

The PWM controller 35, based on the voltage amplitude command (Ug*) and voltage phase (θ), generates pulse width modulation (PWM) signals, and outputs the PWM signals as the drive signals (S1 to S6). The PWM controller 35, for example, generates voltage commands (Vr*, Vs*, Vt*) of the R phase, S phase, and T phase using the computations of the following Expressions 10 to 12. The PWM controller 35 generates the drive signals (S1 to S6) based on the voltage commands (Vr*, Vs*, Vt*). Because of this, the power converter 10 can output an output voltage in synchrony with the voltage phase (θ).

$$Vr^* = Ug^* \times \cos(\theta) \qquad \qquad 10$$

$$Vs^* = Ug^* \times \cos(\theta - 2\pi/3) \qquad \qquad 11$$

$$Vt^* = Ug^* \times \cos(\theta + 2\pi/3) \qquad 12$$

Corrector

As heretofore described, the corrector 32, based on the oscillation component of the voltage amplitude (Ug) acquired by the phase and amplitude detector 20, corrects the q-axis current command (Iq*) and d-axis current command (Id*) or the q-axis current (Iq) and d-axis current (Id).

As shown in FIG. 2, the corrector 32 includes a gain computer 50, a switcher 51, and multipliers (52 to 55). The gain computer 50, based on the oscillation component of the voltage amplitude (Ug) acquired by the phase and amplitude detector 20, generates an adjustment gain (K).

Figure 4:
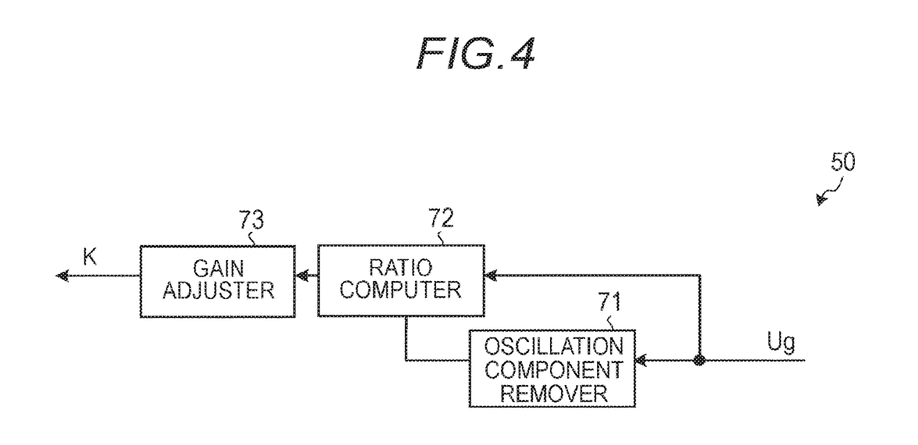
FIG. 4 is a diagram showing one example of a gain computer shown in FIG. 2.

FIG. 4 is a diagram showing one example of a configuration of the gain computer 50. As shown in FIG. 4, the gain computer 50 includes an oscillation component remover 71, a ratio computer 72, and a gain adjuster 73. The oscillation component remover 71 removes an oscillation component (ΔUg) from the voltage amplitude (Ug) acquired by the phase and amplitude detector 20, and outputs the voltage amplitude (Ug) from which the oscillation component (ΔUg) has been removed as a voltage amplitude (Ug'). The voltage amplitude (Ug') in which the oscillation component (ΔUg) has been removed from the voltage amplitude (Ug) is the voltage amplitude of a fundamental frequency of the power system 3 (hereafter referred to as a fundamental amplitude voltage). The oscillation component (ΔUg) is sometimes called a ripple component.

Figure 5:
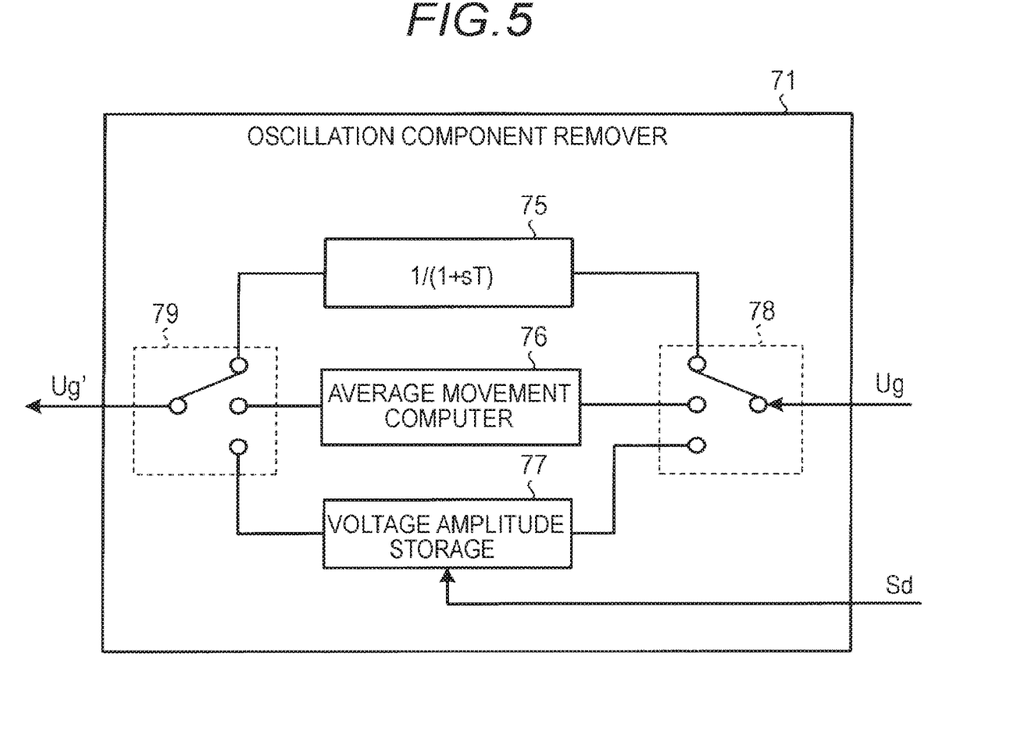
FIG. 5 is a diagram showing one example of an oscillation component remover shown in FIG. 4.

FIG. 5 is a diagram showing a configuration example of the oscillation component remover 71. As shown in FIG. 5, the oscillation component remover 71 includes a low-pass filter 75, an average movement computer 76, a voltage amplitude storage 77, and switchers (78, 79). The oscillation component remover 71, for example, selectively executes one of three processes as an oscillation component (ΔUg) removal process, based on a setting from an unshown input unit.

For example, when set in a first mode, the oscillation component remover 71 removes the oscillation component (ΔUg) from the voltage amplitude (Ug) using the low-pass filter 75, and outputs the voltage amplitude (Ug) from which the oscillation component (ΔUg) has been removed. Also, when set in a second mode, the oscillation component remover 71 removes the oscillation component (ΔUg) from the voltage amplitude (Ug) by computing an average movement of the voltage amplitude (Ug) using the average movement computer 76, and outputs the voltage amplitude (Ug) from which the oscillation component (ΔUg) has been removed. The average movement computer 76 removes the oscillation component (ΔUg) from the voltage amplitude (Ug) by computing an average value of the voltage amplitude (Ug) in a latest period (Ta). The period (Ta) of the average movement computer 76 can be changed by setting.

Also, when set in a third mode, the oscillation component remover 71 stores the voltage amplitude (Ug) before a voltage abnormality of the power system 3 occurs in the voltage amplitude storage 77, and outputs the voltage amplitude (Ug) stored in the voltage amplitude storage 77 as the voltage amplitude (Ug'). The voltage amplitude storage 77, for example, updates the cyclically (for example, once a second) stored voltage amplitude (Ug) until the abnormality detection signal (Sd) is output from the voltage abnormality detector 22, and stops updating the stored voltage amplitude (Ug) after the abnormality detection signal (Sd) is output from the voltage abnormality detector 22.

The oscillation component remover 71 shown in FIG. 5 is such that mode selection is carried out using the switchers (78, 79), but provided that mode switching can be carried out, a configuration in which the switchers (78, 79) are not used may be adopted. Also, the oscillation component remover 71 shown in FIG. 5 may be other configurations such that any one or two of the heretofore described three modes are executed.

Returning to FIG. 4, the description of the corrector 32 will be continued. The ratio computer 72 computes a ratio (Rg) between the voltage amplitude (Ug) and voltage amplitude (Ug'). The ratio computer 72, for example, determines the ratio (Rg) using the computation of the following Expression 13.

$$Rg = Ug/Ug' \qquad 13$$

The gain adjuster 73 determines the adjustment gain (K) by multiplying the ratio (Rg) by a gain (K1). The gain (K1) is, for example, a value greater than 0 and equal to or less than 1, and a value (for example, 0.7) set in advance in the gain adjuster 73, but the gain (K1) can be set based on an input from an unshown input unit.

Returning to FIG. 2, the description of the corrector 32 will be continued. The switcher 51, for example, outputs the adjustment gain (K) to the multipliers (52, 53) or to the multipliers (54, 55) when the oscillation component (ΔUg) included in the voltage amplitude (Ug) is equal to or greater than a threshold (Uth).

Figure 6:
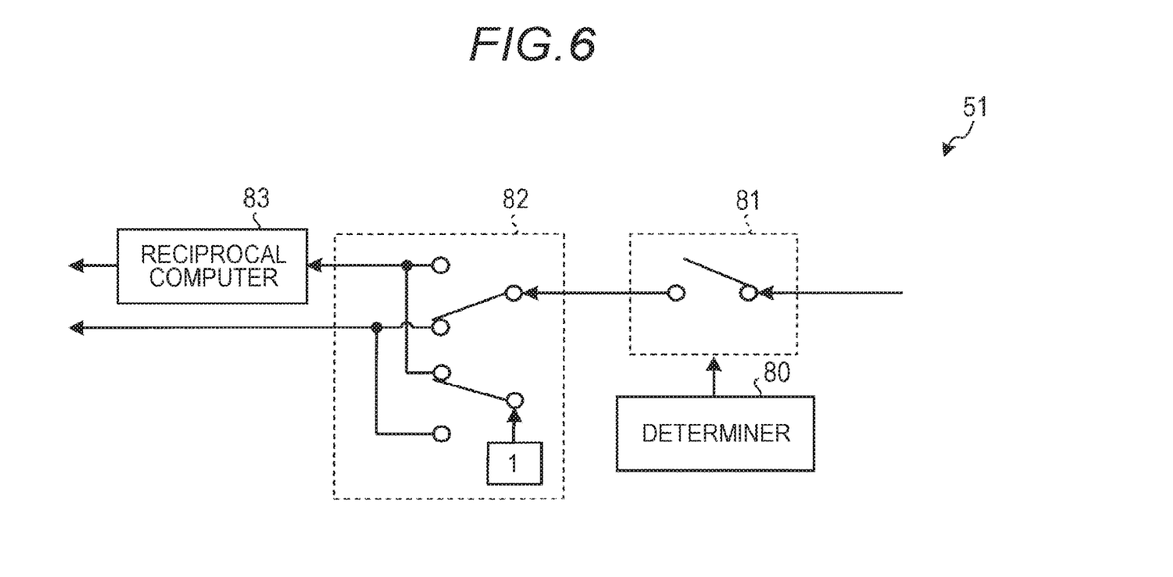
FIG. 6 is a diagram showing one example of a switcher shown in FIG. 2.

FIG. 6 is a diagram showing one example of the switcher 51. As shown in FIG. 6, the switcher 51 includes a determiner 80, a switch 81, a switcher 82, and a reciprocal computer 83. When the oscillation component (ΔUg) included in the voltage amplitude (Ug) is equal to or greater than the threshold (Uth), the determiner 80 outputs the adjustment gain (K) by turning on the switch 81, and when the oscillation component (ΔUg) is less than the threshold (Uth), the determiner 80 stops the output of the adjustment gain (K) by turning off the switch 81. When stopping the output of the adjustment gain (K) by turning off the switch 81, the determiner 80, for example, outputs "1" in place of the adjustment gain (K). Also, the switcher 51 may be of a configuration in which, for example, the determiner 80 and switch 81 are not provided.

The switcher 82, for example, switches an output destination of the adjustment gain (K) based on a mode set in advance from an unshown input unit. For example, when the setting from the input unit is a first mode indicating a correction of an output current command, the switcher 82 outputs the adjustment gain (K) to the multipliers (52, 53), and outputs "1" to the multipliers (54, 55) via the reciprocal computer 83. Also, when the setting from the input unit is a second mode indicating a correction of an output current, the switcher 82 outputs the adjustment gain (K) to the multipliers (54, 55) via the reciprocal computer 83, and outputs "1" to the multipliers (52, 53). The reciprocal computer 83 computes a reciprocal of the adjustment gain (K), and outputs the reciprocal of the adjustment gain (K) to the multipliers (52, 53) as an adjustment gain (Kx) (=1/K). When "1" is input from the switcher 82, the reciprocal computer 83 outputs "1" to the multipliers (54, 55).

The switcher 51 shown in FIG. 6 may be other configuration such that the switcher 51 may be structured without the switcher 82. In such a case, the output destination of the adjustment gain (K) is, for example, either the multipliers (52, 53) or the multipliers (54, 55).

Returning to FIG. 2, the description of the corrector 32 will be continued. The multiplier 52 multiplies the q-axis current command (Iq*) by the adjustment gain (K) or "1" output from the switcher 51, and outputs a result as the q-axis current command (Iq**). Also, the multiplier 53 multiplies the d-axis current command (Id*) by the adjustment gain (K) or "1" output from the switcher 51, and outputs a result as the d-axis current command (Id**).

Also, the multiplier 54 multiplies the q-axis current (Iq) by the adjustment gain (Kx) or "1" output from the switcher 51, and outputs a result as the q-axis current (Iq'). Also, the multiplier 55 multiplies the d-axis current (Id) by the adjustment gain (Kx) or "1" output from the switcher 51, and outputs a result as the d-axis current (Id'). The gain adjuster 73, switcher 51, and multipliers (52 to 55) correspond to one example of a correction process unit.

Figure 7A:
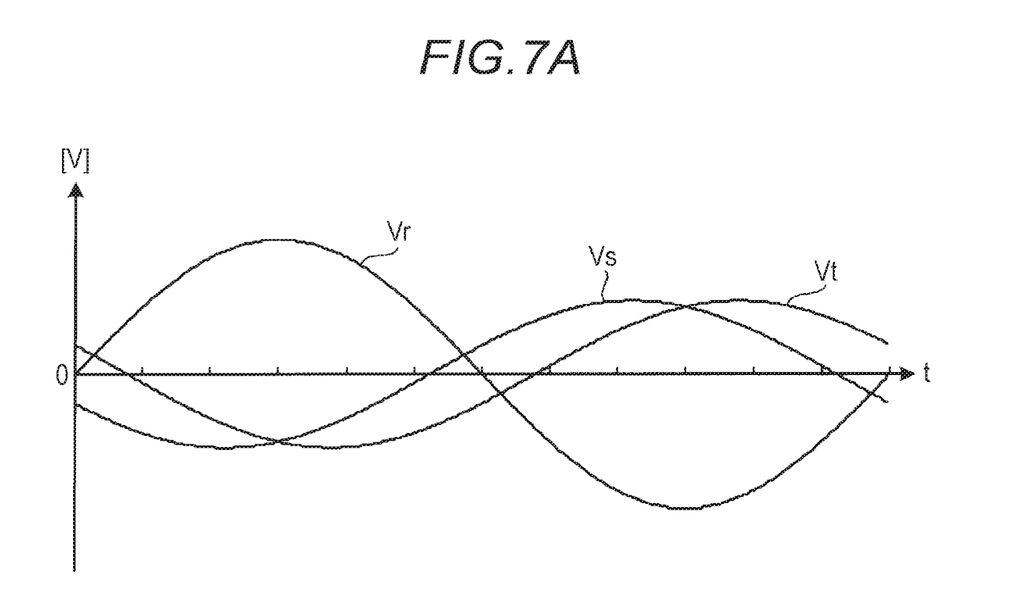
FIG. 7A is a diagram showing one example of a voltage abnormality of a power system.

A description will be given of a case in which a voltage abnormality occurs in the power system 3. FIG. 7A is a diagram showing one example of a voltage abnormality of the power system 3. A voltage abnormality in which the R phase, S phase, and T phase voltages (Vr, Vs, Vt) of the power system 3 (hereafter referred to as the system phase voltages (Vr, Vs, Vt)) are unbalanced is shown in the example shown in FIG. 7A.

Figure 7B:
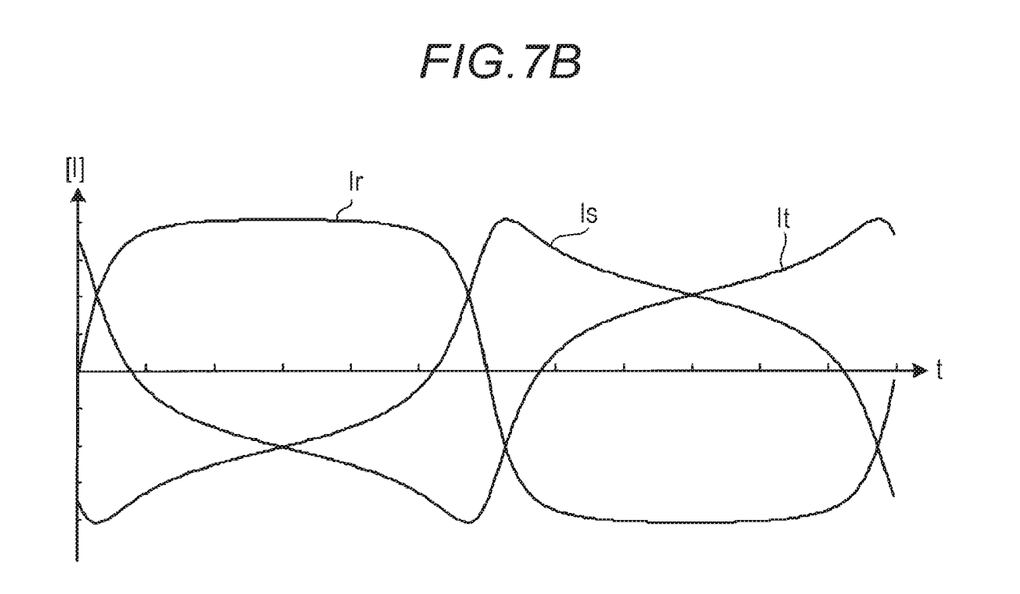
FIG. 7B is a diagram showing a state of output currents when there is no correction by a corrector in the state of voltage abnormality.
Figure 7C:
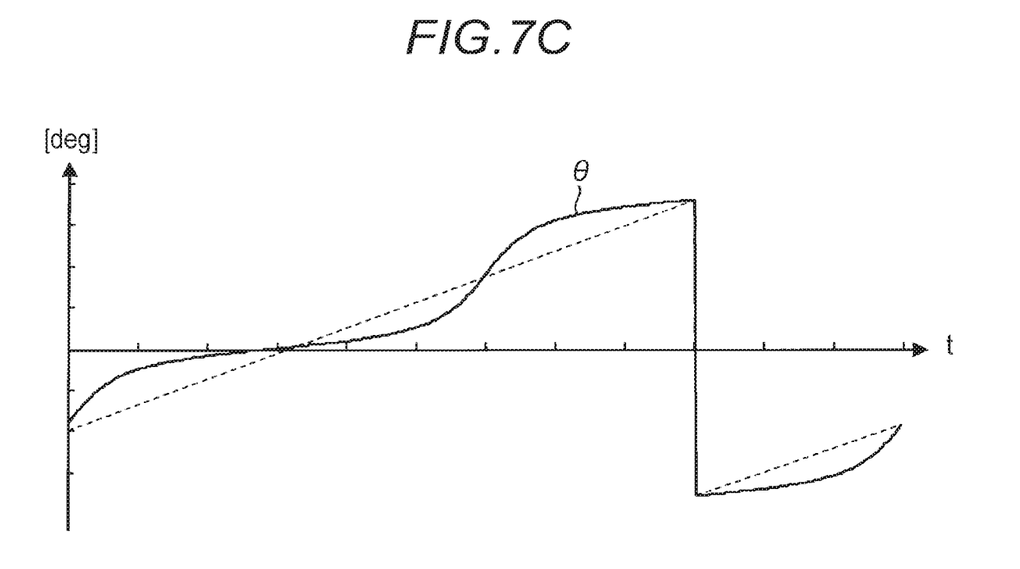
FIG. 7C is a diagram showing a state of a voltage phase in the state of voltage abnormality.
Figure 7D:
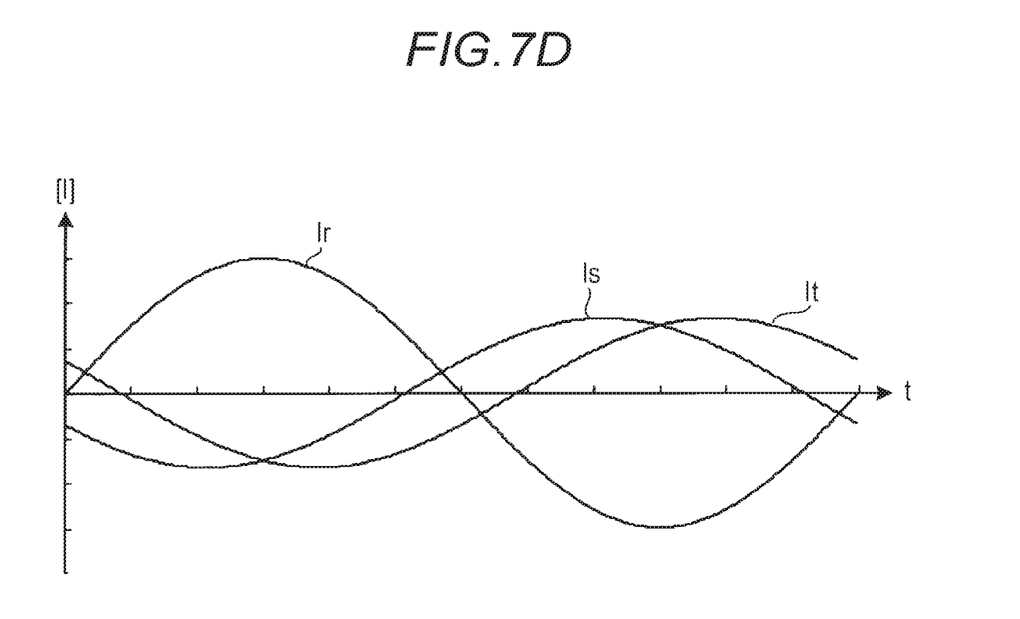
FIG. 7D is a diagram showing a state of the output currents when there is a correction by the corrector in the state of voltage abnormality.

Also, FIG. 7B is a diagram showing a state of the output currents (Ir, Is, It) when there is no correction by the corrector 32 in the state of voltage abnormality shown in FIG. 7A, and FIG. 7C is a diagram showing a state of the voltage phase ($\theta$) in the state of voltage abnormality shown in FIG. 7A. Also, FIG. 7D is a diagram showing a state of the output currents (Ir, Is, It) when there is a correction by the corrector 32 in the state of voltage abnormality shown in FIG. 7A.

When a voltage abnormality occurs in the power system 3 as shown in FIG. 7A, the output currents (Ir, Is, It) take on a distorted state, as shown in FIG. 7B, when there is no corrector 32 in the controller 23, and it may happen that an excessive ripple occurs in the output currents (Ir, Is, It). As a result of this, an overcurrent or the like occurs, and there is concern about the controller 23 of the power converting device 1 stopping control of the power converter 10.

Distortion occurring in the output currents (Ir, Is, It) in this way is due to the voltage phase ($\theta$) in the state of voltage abnormality taking on the state shown in FIG. 7C. The voltage phase ($\theta$) in a state when voltage is normal is in a state indicated by a broken line in FIG. 7C. The q-axis current command (Iq*) and d-axis current command (Id*) are generated on the assumption of the voltage phase ($\theta$) being in the state of when voltage is normal, because of which the output currents (Ir, Is, It) take on the state shown in FIG. 7B due to the voltage amplitude command (Ug*) after current control by the q-axis current command (Iq*) and d-axis current command (Id*) being converted into the voltage commands (Vr*, Vs*, Vt*) in accordance with the voltage phase ($\theta$) when voltage is abnormal.

Meanwhile, when a voltage abnormality occurs in the power system 3, the controller 23 corrects the q-axis current command (Iq*) and d-axis current command (Id*), or the q-axis current (Iq) and d-axis current (Id), using the corrector 32, based on the oscillation component ($\Delta$Ug). By so doing, distortion of the output currents (Ir, Is, It) is restricted, as shown in FIG. 7D, and an occurrence of an excessive ripple in the output currents (Ir, Is, It) can be restricted. Because of this, output current accuracy can be increased and, for example, an occurrence of an unnecessary paralleling off when voltage is abnormal can be restricted. Also, an occurrence of an overcurrent or the like can be restricted further compared with a case of holding the voltage phase ($\theta$) at a normal time and switching when the system voltage is abnormal, and the output current can be accurately controlled.

Also, the corrector 32 computes the ratio (Rg) between the voltage amplitude (Ug) and the voltage amplitude (Ug') in which the oscillation component ($\Delta$Ug) has been removed from the voltage amplitude (Ug), and corrects the q-axis current command (Iq*) and d-axis current command (Id*), or the q-axis current (Iq) and d-axis current (Id), based on the ratio (Rg). The voltage amplitude (Ug') in which the oscillation component ($\Delta$Ug) has been removed from the voltage amplitude (Ug) is the fundamental amplitude voltage of the power system 3, and an oscillation component ($\Delta$Rg) of the ratio (Rg) is a ratio of the oscillation component ($\Delta$Ug) with respect to the fundamental amplitude voltage.

Because of this, the corrector 32 can carry out output current control using the appropriate adjustment gain (K) by correcting the q-axis current command (Iq*) and d-axis current command (Id*), or the q-axis current (Iq) and d-axis current (Id), based on the oscillation component ($\Delta$Rg) of the ratio (Rg), and output current accuracy can be increased.

Also, the corrector 32 can carry out removal of the oscillation component ($\Delta$Ug) from the voltage amplitude (Ug) using the low-pass filter 75, because of which output can be delayed with respect to input while accurately carrying out removal of the oscillation component ($\Delta$Ug). Because of this, for example, the ratio (Rg) at a timing at which a system voltage abnormality occurs is the ratio between the voltage amplitude (Ug) after a voltage drop and the voltage amplitude (Ug') occurring at the voltage amplitude (Ug) before the voltage drop. Because of this, the output current can be reduced by a ratio in accordance with a system voltage drop rate. Also, by increasing a time constant of the low-pass filter 75, a period for which the output current is suppressed in accordance with the system voltage drop rate can be lengthened.

Also, the corrector 32 can carry out removal of the oscillation component ($\Delta$Ug) from the voltage amplitude (Ug) using the average movement computer 76, because of which the removal of the oscillation component ($\Delta$Ug) can be carried out accurately. Also, in the same way as when using the low-pass filter 75, the ratio (Rg) at a timing at which a system voltage abnormality occurs is the ratio between the voltage amplitude (Ug) after a voltage drop and the voltage amplitude (Ug') occurring at the voltage amplitude (Ug) before the voltage drop, because of which the output current can be reduced by a ratio in accordance with a system voltage drop rate. By lengthening a period of average movement, a period for which the output current is reduced at a rate in accordance with the system voltage drop rate can be lengthened.

Also, the corrector 32 has the voltage amplitude storage 77 that stores the voltage amplitude (Ug) before a voltage abnormality of the power system 3 occurs (hereafter referred to as a voltage amplitude (Ugm)), and when a voltage abnormality of the power system 3 occurs, the corrector 32 computes the ratio between the voltage amplitude (Ug) and voltage amplitude (Ugm) as the ratio (Rg). Because of this, when the system voltage drops, the output current can be reduced by a rate in accordance with the system voltage drop rate. The corrector 32 can also store the voltage amplitude (Ug) from which the oscillation component ($\Delta$Ug) has been removed using the low-pass filter 75 or average movement computer 76, before a voltage abnormality of the power system 3 occurs, in the voltage amplitude storage 77 as the voltage amplitude (Ugm).

Also, the system phase voltages (Vr, Vs, Vt) are balanced, with the three phases in a state of equilibrium, before a voltage abnormality of the power system 3 occurs, because of which the oscillation component (ΔUg) included in the voltage amplitude (Ug) can be ignored. Because of this, the corrector 32 can be caused to operate continuously from a state in which the power system 3 is normal. In this case, even when a system voltage abnormality occurs, a process counteracting the system voltage abnormality can be carried out promptly from the timing at which the voltage abnormality occurs, without changing a process of the controller 23, and the output current can be accurately controlled. Meanwhile, when holding the voltage phase (θ) at a normal time and switching when the system voltage is abnormal, accurately controlling the output current is difficult from a timing at which a voltage abnormality occurs until determining that there is a system voltage abnormality.

Also, the switcher 51 outputs the adjustment gain (K) when the oscillation component (ΔUg) included in the voltage amplitude (Ug) is equal to or greater than the threshold (Uth), and stops the output of the adjustment gain (K) when the oscillation component (ΔUg) is less than the threshold (Uth). Depending on the power system 3 connected to the power converting device 1, there is concern about the oscillation component (ΔUg) included in the voltage amplitude (Ug) increasing due to, for example, a problem with a power transmission environment or the like. In this kind of case, the controller 23 can stop the correction process carried out by the corrector 32. Because of this, when the oscillation component (ΔUg) included in the voltage amplitude (Ug) is large despite the power system 3 being normal, the effect of the correction by the corrector 32 can be eliminated. The switcher 51 need not be provided when, for example, there is little effect from the correction by the corrector 32 when the power system 3 is normal, or the like.

Figure 8:
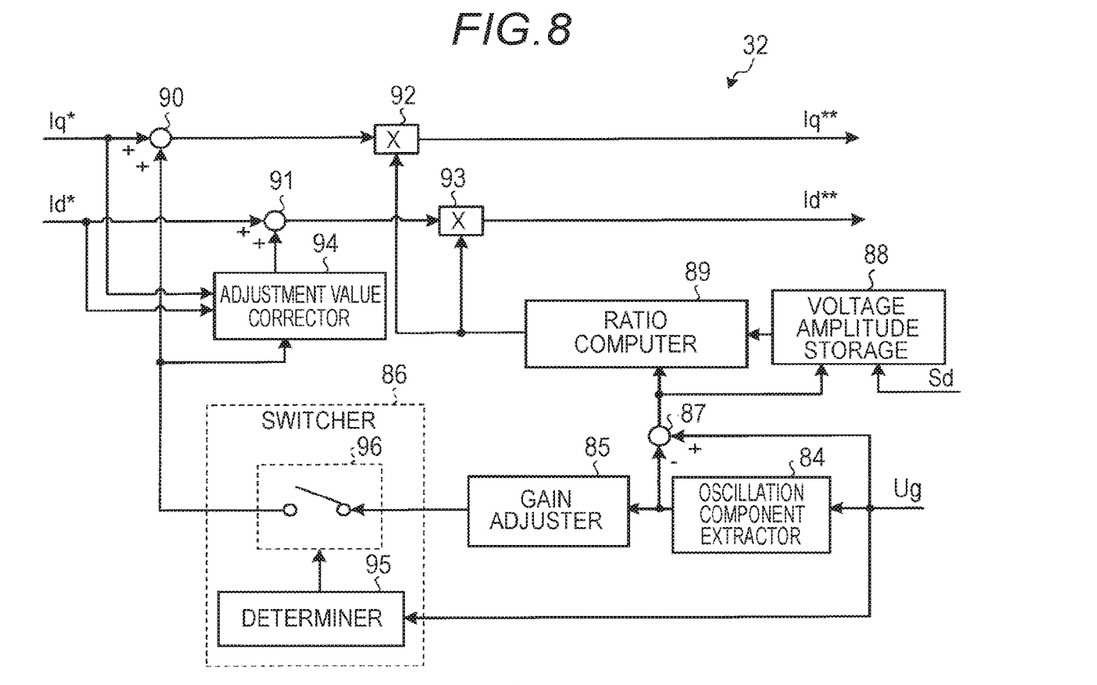
FIG. 8 is a diagram showing another configuration example of the corrector.

The corrector 32 computes the ratio (Rg) between the voltage amplitude (Ug) and the voltage amplitude (Ug') in which the oscillation component (ΔUg) has been removed from the voltage amplitude (Ug), and carries out output current control based on the ratio (Rg), but the corrector 32 may be of a configuration in which the ratio (Rg) is not used. FIG. 8 is a diagram showing another configuration example of the corrector 32.

As shown in FIG. 8, the corrector 32 includes an oscillation component extractor 84, a gain adjuster 85, a switcher 86, a subtractor 87, a voltage amplitude storage 88, a ratio computer 89, adders (90, 91), multipliers (92, 93), and an adjustment value corrector 94.

The oscillation component extractor 84 extracts the oscillation component (ΔUg) from the voltage amplitude (Ug) acquired by the phase and amplitude detector 20. The oscillation component extractor 84 is structured of, for example, a high-pass filter. The gain adjuster 85 determines an adjustment value (Ki) by multiplying the oscillation component (ΔUg) extracted by the oscillation component extractor 84 by a gain (K2).

The switcher 86 outputs the adjustment value (Ki) to the adders (90, 91) when the oscillation component (ΔUg) included in the voltage amplitude (Ug) is equal to or greater than the threshold (Uth). The switcher 86 includes a determiner 95 and a switch 96. The determiner 95, in the same way as the determiner 80, determines whether or not the oscillation component (ΔUg) is equal to or greater than the threshold (Uth), and controls the switch 96. The corrector 32 may be of a configuration in which the switcher 86 is not provided.

The adder 90 adds the adjustment value (Ki) to the q-axis current command (Iq*). Also, the adder 91 adds an adjustment value (Ki') corrected by the adjustment value corrector 94 to the d-axis current command (Id*). The adjustment value corrector 94 determines the adjustment value (Ki') by, for example, carrying out the computation of the following Expression 14.

$$Ki' = Ki \times (Id^*/Iq^*) \quad \quad 14$$

In this way, the corrector 32 shown in FIG. 8 generates the adjustment value (Ki) in accordance with the oscillation component (ΔUg), and corrects the q-axis current command (Iq*) and d-axis current command (Id*) based on the adjustment value (Ki). Because of this, output current distortion is restricted, and an occurrence of an excessive ripple in the output current can be restricted. In the example shown in FIG. 8, the q-axis current command (Iq*) and d-axis current command (Id*) are corrected based on the adjustment value (Ki), but the corrector 32 can also be provided with a configuration in which the q-axis current (Iq) and d-axis current (Id) are corrected based on a reciprocal of the adjustment value (Ki).

The subtractor 87, by subtracting the oscillation component (ΔUg) from the voltage amplitude (Ug), computes the voltage amplitude (Ug') in which the oscillation component (ΔUg) has been removed from the voltage amplitude (Ug). The voltage amplitude storage 88, for example, in the same way as the voltage amplitude storage 77, updates the cyclically stored voltage amplitude (Ug') until the abnormality detection signal (Sd) is output from the voltage abnormality detector 22, and stops updating the stored voltage amplitude (Ug') after the abnormality detection signal (Sd) is output from the voltage abnormality detector 22.

The ratio computer 89, in the same way as the ratio computer 72, computes the ratio (Rg) between the voltage amplitude (Ug') in which the oscillation component (ΔUg) has been removed from the voltage amplitude (Ug) by the subtractor 87 and the voltage amplitude (Ug') stored in the voltage amplitude storage 88. The multiplier 92 generates the q-axis current command (Iq) by multiplying a result of an addition by the adder 90 by the ratio (Rg). Also, the multiplier 93 generates the d-axis current command (Id) by multiplying a result of an addition by the adder 91 by the ratio (Rg). Because of this, the output current can be reduced at a rate in accordance with a system voltage drop rate. The corrector 32 may also be of a configuration in which the subtractor 87, voltage amplitude storage 88, ratio computer 89, and multipliers (92, 93) are not provided. The gain adjuster 85, switcher 86, multipliers (90, 91), and adjustment value corrector 94 correspond to one example of a correction processor.

Figure 9:
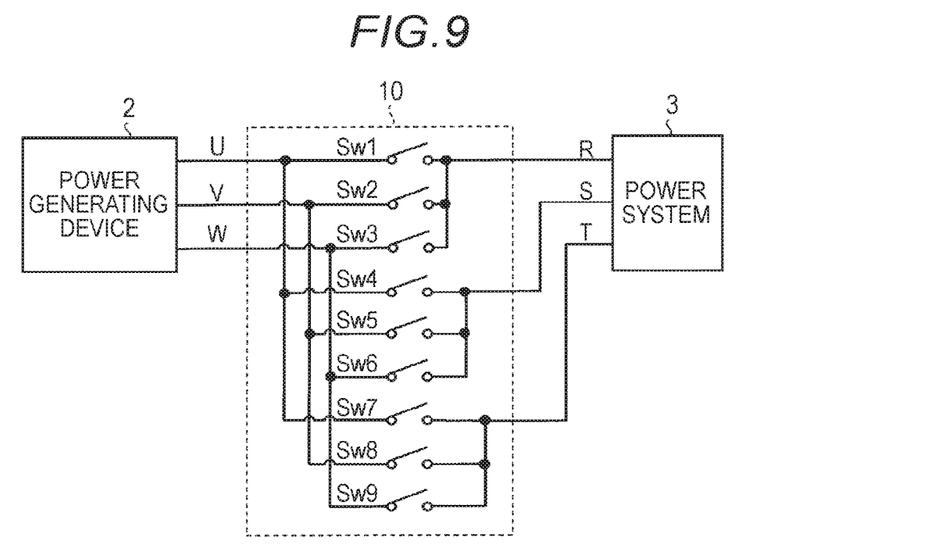
FIG. 9 is a diagram showing another configuration example of the power converter.

The power converting device 1 shown in FIG. 2 shows an example in which the step-up circuit 16 and inverter circuit 17 are the power converter 10, but the power converter 10 of the power converting device 1 shown in FIG. 2 may be other configuration such a matrix converter including the power converter 10 including multiple switches (Sw1 to Sw9), as shown in FIG. 9. FIG. 9 is a diagram showing one example of the power converter 10, in which the multiple bidirectional switches (Sw1 to Sw9) are switches connecting the phases of the power generating device 2 and the phases of the power system 3. The bidirectional switches (Sw1 to Sw9) are structured of multiple switching elements (for example, MOSFETs or IGBTs), or the like, whose continuity direction can be controlled.

In the heretofore described example, q-axis and d-axis current correction are carried out, but in a case of, for example, unity power factor control, the power converting device 1 can also carry out q-axis current correction alone.

Current Control Flow

Figure 10:
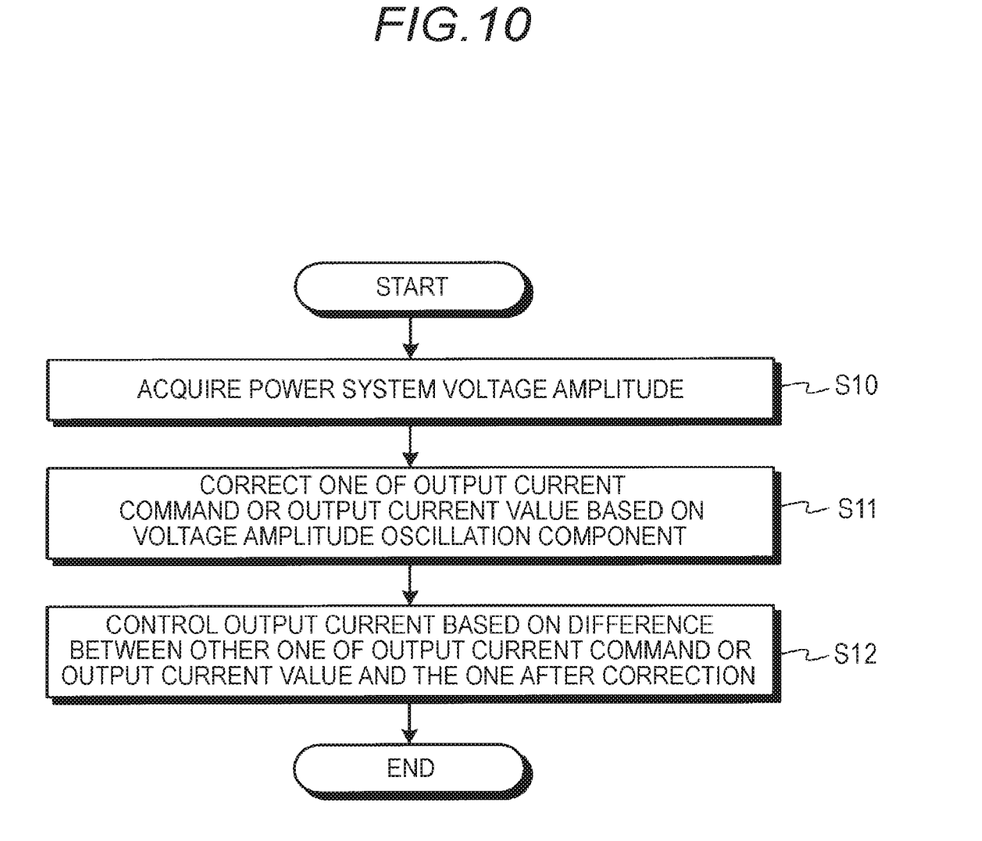
FIG. 10 is a flowchart showing one example of a flow of an output current control process executed by a controller.

Referring to FIG. 10, a specific description will be given of one example of an output current control process executed by the controller 23. FIG. 10 is a flowchart showing one example of a power conversion process executed by the controller 23.

As shown in FIG. 10, the phase and amplitude detector 20 acquires the voltage amplitude (Ug) of the power system 3 (step S10). The controller 23, based on the oscillation component (ΔUg) of the voltage amplitude (Ug), corrects one of an output current command (the q-axis current command (Iq*) or d-axis current command (Id*)) or an output current value (the q-axis current (Iq) or d-axis current (Id)) (step S11).

The controller 23 controls the output current from the power converter 10 to the power system 3 by controlling the power converter 10 based on a difference between the other of the output current command or output current value and the one after correction (step S12).

As heretofore described, the power converting device 1 according to the embodiment, by correcting one of an output current command or output current value based on the oscillation component (ΔUg) of the voltage amplitude (Ug), can restrict an occurrence of an overcurrent or the like, and can accurately control the output current.

Other

The power converting device 1 shown in FIGS. 1 and 2 is of a configuration including the power converter 10, but may have, for example, the following configuration as a control device that controls the power converter 10.

Configuration Example

A control device includes a voltage amplitude acquirer that acquires the voltage amplitude (Ug) of the power system 3, and the controller 23 that generates the commands (Uq*, Ud*) (examples of output voltage commands) controlling the output current to the power system 3 based on the oscillation component (ΔUg) of the voltage amplitude (Ug) acquired by the voltage amplitude acquirer, the controller 23 being characterized by including a current acquirer that acquires the output currents (Iq, Id) to the power system 3, a corrector that corrects the output current commands (Iq*, Id*), or the output currents (Iq, Id) detected by the current acquirer, based on the oscillation component (ΔUg) of the voltage amplitude (Ug) acquired by the voltage amplitude acquirer, and a current controller that generates the commands (Uq*, Ud*) (examples of output voltage commands) controlling the output current to the power system 3 based on the output current commands (Iq*, Id*) or output currents (Iq, Id) corrected by the corrector.

Further advantages and modification examples can easily be derived by those skilled in the art. Because of this, a wider aspect of the disclosure is not limited to the specific details or representative embodiment expressed and described as above. Consequently, various modifications, combinations, sub-combinations, and alterations may be made without departing from the spirit or scope of the disclosure defined by the appended claims or equivalents thereof.

In recent years, the introduction of power generating devices such as a photovoltaic cell or wind power generator is spreading. A system-connecting power converting device is installed between the power generating device and a power system. The power converting device converts power generated by the power generating device into alternating current power in accordance with a frequency of the power system, and outputs the alternating current power to the power system.

When a power generating device is connected to a large number of power systems over a wide area, there is concern about power quality being seriously affected when the power systems are paralleled off simultaneously due to a power system disturbance. Because of this, there is demand for a power converting device to include a function that restricts an unnecessary paralleling off, and continues operation, when there is a system voltage abnormality, such as when there is a momentary voltage drop in a power system.

A system voltage abnormality occurs due to, for example, a line-to-line short circuit. When a line-to-line short circuit occurs, the system voltage becomes unbalanced. There is concern about a power converting device losing a voltage phase when the system voltage is unbalanced.

A power converting device according to an embodiment of the present invention includes a power converter, a voltage amplitude acquirer, and a controller. The power converter is connected to a power system. The voltage amplitude acquirer acquires a voltage amplitude of the power system. The controller controls an output current from the power converter to the power system based on an oscillation component of the voltage amplitude acquired by the voltage amplitude acquirer.

Obviously, numerous modifications and variations of the present invention are possible in light of the above teachings. It is therefore to be understood that within the scope of the appended claims, the invention may be practiced otherwise than as specifically described herein.

What is claimed is:

1. A power converting device, comprising:
   power conversion circuitry connected to a power system;
   voltage detection circuitry that detects a direct current voltage supplied from a power generating device to the power conversion circuitry;
   voltage amplitude detection circuitry that acquires a voltage amplitude of the power system;
   current detection circuitry that detects an output current from the power conversion circuitry to the power system; and
   control circuitry configured to control the output current from the power conversion circuitry to the power system based on an oscillation component of the voltage amplitude,
   wherein the control circuitry is configured to remove the oscillation component from the voltage amplitude acquired by the voltage amplitude detection circuitry to generate a second voltage amplitude, compute a ratio between the voltage amplitude acquired by the voltage amplitude detection circuitry and the second voltage amplitude from which the oscillation component has been removed, and correct the output current command or the output current detected by the current detection circuitry based on a result of the computation of the ratio.

2. The power converting device according to claim 1, wherein the control circuitry is configured to remove the oscillation component from the voltage amplitude by computing an average movement of the voltage amplitude.

3. The power converting device according to claim 1, wherein the control circuitry includes a low-pass filter that removes the oscillation component from the voltage amplitude and is configured to compute the ratio between the voltage amplitude acquired by the voltage amplitude detection circuitry and the second voltage amplitude from which the oscillation component has been removed by the low-pass filter, and correct the output current command or the output current detected by the current detection circuitry based on a result of the computation of the ratio between the voltage amplitude acquired by the voltage amplitude detection circuitry and the second voltage amplitude from which the oscillation component has been removed by the low-pass filter.

4. The power converting device according to claim 1, further comprising:
   a memory that stores the voltage amplitude acquired by the voltage amplitude detection circuitry before a voltage abnormality of the power system occurs,
   wherein the control circuitry is further configured to compute a ratio between the voltage amplitude acquired by the voltage amplitude detection circuitry and the voltage amplitude stored by the memory when the voltage abnormality of the power system occurs, and correct the output current command or the output current detected by the current detection circuitry based on a result of the computation of the ratio between the voltage amplitude acquired by the voltage amplitude detection circuitry and the voltage amplitude stored by the memory.

5. The power converting device according to claim 1, wherein the control circuitry is further configured to multiply the output current command or the output current detected by the current detection circuitry by a value in accordance with a result of the computation of the ratio.

6. The power converting device according to claim 1, wherein the control circuitry is further configured to extract the oscillation component from the voltage amplitude acquired by the voltage amplitude detection circuitry, and correct the output current command or the output current detected by the current detection circuitry based on the oscillation component extracted from the voltage amplitude.

7. The power converting device according to claim 6, wherein the control circuitry is further configured to add a value in accordance with the oscillation component extracted from the voltage amplitude to the output current command or the output current detected by the current detection circuitry.

8. The power converting device according to claim 6, further comprising:
   a memory that stores a second voltage amplitude from which the oscillation component has been removed,
   wherein the control circuitry is further configured to compute a ratio between the second voltage amplitude from which the oscillation component has been removed and the voltage amplitude stored by the memory, and multiply the output current command or the output current detected by the current detection circuitry by a value in accordance with a result of the computation of the ratio between the second voltage amplitude from which the oscillation component has been removed and the voltage amplitude stored by the memory.

9. The power converting device according to claim 1, wherein the control circuitry is further configured to determine whether or not the voltage amplitude acquired by the voltage amplitude detection circuitry or the oscillation component of the voltage amplitude is equal to or greater than a threshold, and correct the output current command or the output current detected by the current detection circuitry, based on the oscillation component of the voltage amplitude, when the voltage amplitude or the oscillation component of the voltage amplitude is equal to or greater than the threshold.

10. A power generating system, comprising:
    the power converting device of claim 1; and
    a power generation source connected to the power converting device,
    wherein the power converting device outputs power generated by the power generation source to the power system.

11. A current control method, comprising: detecting a direct current voltage supplied from a power generating device to power conversion circuitry; detecting an output current from the power conversion circuitry to a power system; acquiring, using voltage amplitude detection circuitry, a voltage amplitude of the power system connected to the power conversion circuitry; and controlling, using control circuitry, an output current from the power conversion circuitry to the power system based on an oscillation component of the voltage amplitude, wherein the controlling includes removing the oscillation component from the voltage amplitude acquired using the voltage amplitude detection circuitry to generate a second voltage amplitude, computing a ratio between the voltage amplitude acquired using the voltage amplitude detection circuitry and the second voltage amplitude from which the oscillation component has been removed, and correcting the output current command or the output current based on a result of the computation of the ratio.

12. The current control method according to claim 11, wherein the removing of the oscillation component from the voltage amplitude comprises computing an average movement of the voltage amplitude.

13. The current control method according to claim 11, further comprising:
    storing the voltage amplitude before a voltage abnormality of the power system occurs;
    computing a ratio between the voltage amplitude acquired by the voltage amplitude detection circuitry and the voltage amplitude stored when a voltage abnormality of the power system occurs; and
    correcting the output current command or the output current detected by the current detection circuitry based on a result of the computation of the ratio between the voltage amplitude acquired by the voltage amplitude detection circuitry and the voltage amplitude stored.

14. The current control method according to claim 11, further comprising:
    multiplying the output current command or the output current by a value in accordance with a result of the computation of the ratio.

15. The current control method according to claim 11, further comprising:
    extracting the oscillation component from the voltage amplitude acquired using the voltage amplitude detection circuitry; and
    correcting the output current command or the output current based on the oscillation component extracted from the voltage amplitude.

16. The current control method according to claim 15, further comprising:
    adding a value in accordance with the oscillation component extracted from the voltage amplitude to the output current command or the output current.

17. The power converting device according to claim 2, wherein the control circuitry includes a low-pass filter that removes the oscillation component from the voltage amplitude and is configured to compute the ratio between the voltage amplitude acquired by the voltage amplitude detection circuitry and the second voltage amplitude from which the oscillation component has been removed by the low-pass filter, and correct the output current command or the output current detected by the current detection circuitry based on a result of the computation of the ratio between the voltage amplitude acquired by the voltage amplitude detection circuitry and the second voltage amplitude from which the oscillation component has been removed by the low-pass filter.

18. The power converting device according to claim 2, further comprising:
a memory that stores the voltage amplitude acquired by the voltage amplitude detection circuitry before a voltage abnormality of the power system occurs,
wherein the control circuitry is further configured to compute a ratio between the voltage amplitude acquired by the voltage amplitude detection circuitry and the voltage amplitude stored by the memory when the voltage abnormality of the power system occurs, and correct the output current command or the output current detected by the current detection circuitry based on a result of the computation of the ratio.

19. The power converting device according to claim 2, wherein the control circuitry is further configured to multiply the output current command or the output current detected by the current detection circuitry by a value in accordance with a result of the computation of the ratio.

20. The power converting device according to claim 2, wherein the control circuitry is further configured to extract the oscillation component from the voltage amplitude acquired by the voltage amplitude detection circuitry, and correct the output current command or the output current detected by the current detection circuitry based on the oscillation component extracted from the voltage amplitude.

* * * * *